United States Patent
Leblon et al.

(10) Patent No.: US 9,502,633 B2
(45) Date of Patent: Nov. 22, 2016

(54) METHOD FOR CURRENT-CONTROLLING AT LEAST ONE PIEZOELECTRIC ACTUATOR OF A FUEL INJECTOR OF AN INTERNAL COMBUSTION ENGINE

(71) Applicants: CONTINENTAL AUTOMOTIVE FRANCE, Toulouse (FR); CONTINENTAL AUTOMOTIVE GMBH, Hannover (DE)

(72) Inventors: Michael Leblon, Bressols (FR); Alain Atanasyan, Brax (FR); Jeremie Memain, Lagrace Dieu (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 14/403,428

(22) PCT Filed: May 21, 2013

(86) PCT No.: PCT/EP2013/001495
§ 371 (c)(1),
(2) Date: Nov. 24, 2014

(87) PCT Pub. No.: WO2013/174506
PCT Pub. Date: Nov. 28, 2013

(65) Prior Publication Data
US 2015/0108923 A1     Apr. 23, 2015

(30) Foreign Application Priority Data

May 23, 2012   (FR) .................................. 12 54719
May 4, 2013    (FR) .................................. 13 53096

(51) Int. Cl.
*H01L 41/04*     (2006.01)
*F02D 41/20*     (2006.01)
(Continued)

(52) U.S. Cl.
CPC ......... *H01L 41/042* (2013.01); *F02D 41/2096* (2013.01); *F02D 41/402* (2013.01);
(Continued)

(58) Field of Classification Search
CPC ............. H01L 41/042; F02D 41/2096; F02D 41/402; F02D 2041/2037; F02D 2041/2051; F02M 51/0603; Y02T 10/44

USPC ....... 318/116; 310/300, 316.01, 316.03, 317, 310/318, 311, 10, 12.3; 123/478, 472, 480
See application file for complete search history.

(56) References Cited

U.S. PATENT DOCUMENTS

| 6,907,864 B2 * | 6/2005 | Takemoto ........... F02D 41/2096 |
| | | 123/478 |
| 7,191,744 B2 * | 3/2007 | Minato ..................... F01L 9/04 |
| | | 123/90.12 |

(Continued)

FOREIGN PATENT DOCUMENTS

| CN | 102102609 A   | 6/2011 |
| DE | 10 2004 018211 A1 | 11/2005 |

(Continued)

OTHER PUBLICATIONS

International Search Report, dated Sep. 2, 2013, from corresponding PCT application.

*Primary Examiner* — Rita Leykin
(74) *Attorney, Agent, or Firm* — Young & Thompson

(57) ABSTRACT

Method for controlling a piezoelectric actuator acting on valve elements to open or close a fuel injector respectively allowing or preventing fuel injection into a combustion chamber of an engine, the method includes:
  applying to the piezoelectric actuator a nominal electrical charge to open the injector, as a function of the torque required and the engine speed, to open the valve elements for fuel injection,
  thereafter applying to the actuator at least one electrical polarization charge, to polarize the actuator during an opening phase of the injector and fuel injection into the combustion chamber,
  thereafter commanding the closure of the injector by applying to the actuator at least one electrical discharge to close the valve elements,
the step of applying the electrical polarization charge including a prior step of increasing the value of the charge current to a value greater than that of the nominal charge.

14 Claims, 3 Drawing Sheets

Figure 1A:
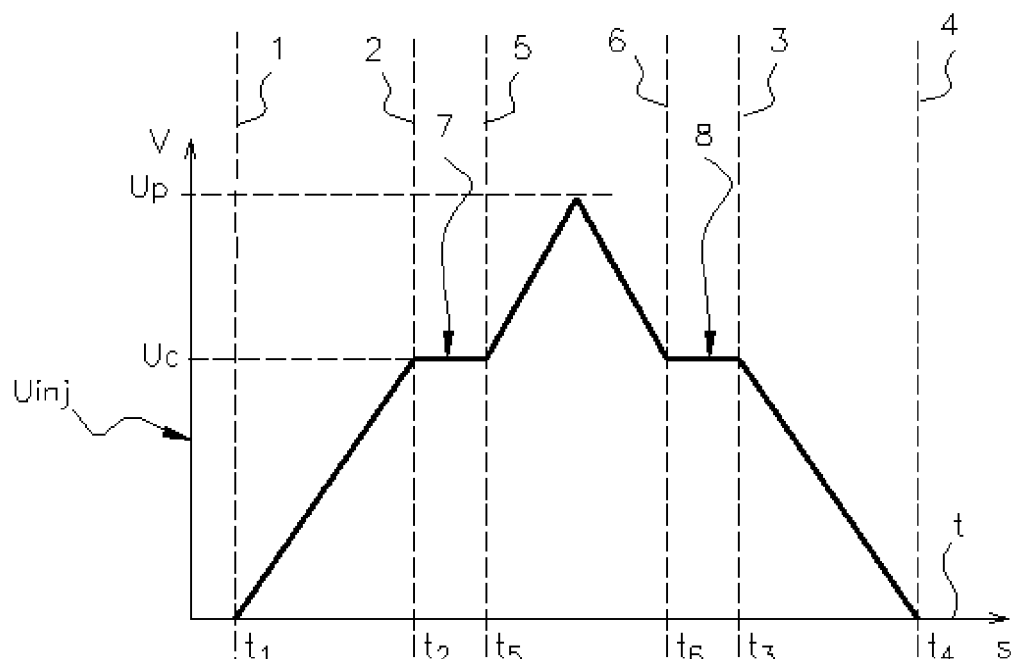

(51) Int. Cl.
  *F02D 41/40* (2006.01)
  *F02M 51/06* (2006.01)
(52) U.S. Cl.
  CPC ............... *F02D2041/2037* (2013.01); *F02D 2041/2051* (2013.01); *F02M 51/0603* (2013.01); *Y02T 10/44* (2013.01)

(56) References Cited

U.S. PATENT DOCUMENTS

| | | | | |
|---|---|---|---|---|
| 7,316,220 | B2 * | 1/2008 | Kikutani | F02D 41/20 123/467 |
| 7,422,005 | B2 * | 9/2008 | Hardy | F02D 41/2096 123/490 |
| 7,520,260 | B2 * | 4/2009 | Nakamura | F01N 3/035 123/299 |
| 7,747,377 | B2 * | 6/2010 | Nakata | F02D 35/028 123/456 |
| 8,051,839 | B2 * | 11/2011 | Spadafora | F02D 41/2096 123/478 |
| 8,714,140 | B2 * | 5/2014 | Borchsenius | F02D 41/008 123/494 |
| 8,863,727 | B2 * | 10/2014 | Jalal | F02D 41/2096 123/472 |
| 2005/0022793 | A1 * | 2/2005 | Takemoto | F02D 41/2096 123/480 |
| 2005/0126534 | A1 * | 6/2005 | Kikutani | F02D 41/20 123/299 |
| 2005/0283301 | A1 * | 12/2005 | Minato | F01L 9/04 701/108 |
| 2006/0012265 | A1 | 1/2006 | Bachmaier et al. | |
| 2007/0074702 | A1 * | 4/2007 | Nakamura | F01N 3/035 123/299 |
| 2007/0240685 | A1 | 10/2007 | Beilharz et al. | |
| 2008/0265715 | A1 | 10/2008 | Dollgast et al. | |
| 2009/0063016 | A1 * | 3/2009 | Nakata | F02D 41/2096 701/103 |
| 2009/0179088 | A1 | 7/2009 | Mochizuki et al. | |
| 2010/0288238 | A1 * | 11/2010 | Beilharz | F02D 41/2096 123/480 |

FOREIGN PATENT DOCUMENTS

| | | | |
|---|---|---|---|
| DE | 10 2004 021 955 A1 | 12/2005 | |
| DE | 10 2004 046 080 A1 | 4/2006 | |
| DE | 10 2005 054 680 A1 | 6/2006 | |
| DE | 10 2007 033 469 A1 | 1/2009 | |
| DE | 10 2007 047 657 B3 | 4/2009 | |
| DE | 10 2007 059 111 A1 | 6/2009 | |
| DE | 10 2009 000 133 A1 | 7/2009 | |
| DE | 102011078844 * | 1/2011 | ............ F02D 41/40 |
| DE | 10 2010 021 448 A1 | 12/2011 | |
| DE | 10 2011 078 844 A1 | 1/2013 | |
| EP | 1 138 910 A1 | 10/2001 | |
| EP | 1 445 459 A1 | 8/2004 | |
| EP | 1 814 167 A1 | 8/2007 | |
| FR | 2 990 998 A1 | 11/2013 | |
| GB | 2 451 754 A | 2/2009 | |
| WO | 2004/001794 A2 | 12/2003 | |
| WO | 2004/040112 A1 | 5/2004 | |
| WO | 2005/061876 A1 | 7/2005 | |
| WO | 2005/081332 A1 | 9/2005 | |
| WO | 2010/097330 A1 | 9/2010 | |

* cited by examiner

METHOD FOR CURRENT-CONTROLLING AT LEAST ONE PIEZOELECTRIC ACTUATOR OF A FUEL INJECTOR OF AN INTERNAL COMBUSTION ENGINE

BACKGROUND OF THE INVENTION

1. Field of the Invention

The present invention relates to a method for controlling at least one piezoelectric actuator of a fuel injector for an internal combustion engine of a vehicle, said at least one piezoelectric actuator acting on a valve means to open or close said injector, respectively allowing or preventing the injection of fuel into a combustion chamber of the engine, said method being applied by an engine control unit on-board the vehicle in operation and comprising the following steps:

application to the piezoelectric actuator of a first nominal electrical charge necessary for opening of the injector, called the nominal control charge, according to a nominal current as a function of the torque required and the engine speed, so as to open the valve means of the injector for the injection of fuel into the combustion chamber, application to the piezoelectric actuator of at least one second electrical charge, called the polarization charge, in addition to said nominal control charge, on said nominal control charge after application thereof and before a step consisting of commanding a closure of the injector, so as to polarize the piezoelectric actuator during an opening phase of the injector and during the injection of fuel into the combustion chamber, commanding the closure of the injector so as to stop the injection of fuel by application to the piezoelectric actuator of at least one electrical discharge, so as to close the valve means.

2. Description of the Related Art

It is known to use a piezoelectric actuator for controlling the opening and closure of an injector in an internal combustion engine operating by means of petrol or diesel fuel.

A piezoelectric actuator is in principle composed, in the known manner, of a ceramic stack defining a determined length, which has the property of modifying its length under the effect of an electrical field and conversely of producing an electrical field under the effect of a mechanical stress; this stack is arranged in an injector between a stop and a valve means and operates in brief as follows: on application of an electrical charge to the piezoelectric actuator by means of an electrical voltage, its length increases and opens the valve means of the injector which releases pressurized fuel into the combustion chamber. At rest, i.e. with the valve means in the closed position, a clearance exists between the piezoelectric actuator and the valve means, so as to guarantee closure of this valve means and avoid uncontrolled fuel leaks towards the combustion chamber.

In order to be stable and have a reproducible behavior, a piezoelectric actuator must be polarized to a reference value, called the initial polarization; this is done in the factory on production of said actuator before the engine is used in a vehicle. Such a polarization consists of applying to the terminals of the piezoelectric actuator an electrical charge via a determined voltage, called the polarization voltage, for a time also determined, the effect of which is to orient the crystalline structure of the latter according to the direction of the electrical field imposed on the piezoelectric stack, which corresponds to the direction in which the variation in dimension of the piezoelectric actuator is desired. After elimination of this initial polarization voltage at the terminals of the piezoelectric stack, the latter retains a residual polarization state for subsequent usage.

However, during use in an internal combustion engine, a piezoelectric actuator tends to lose this initial polarization, in particular due to essentially urban use of the vehicle which leads to low engine speeds and hence low nominal electrical voltages for controlling the injectors under a low fuel pressure, largely below the polarization voltage.

Also, the electrical charge necessary to control the opening of the injectors may be adjusted to prevent the noise created by this injector opening being audible above the general engine noise, i.e. a map of nominal voltages for opening the injectors is established in the factory as a function of the engine speed.

Other usage conditions such as repeated cycles of increase/reduction in engine temperature, or long periods without use of the piezoelectric actuator corresponding to periods of extended immobilization of the vehicle, may also over time lead to a change in the polarization of the piezoelectric actuator.

French patent application FR 1254719 filed on 23 May 2012, not published at the date of filing of the present application, in the name of the applicant, discloses a solution to remedy the drawbacks of the depolarization described above. This solution allows the piezoelectric actuator to remain polarized automatically from the time of leaving the factory during usage of the vehicle, without requiring stoppage of the engine, and thus allows an extension of the service life of said actuators while reducing the maintenance operations. It also allows an improvement in performance of the injector by reducing the spread of clearance between the piezoelectric actuator and the valve means, and finally allows better control of the quantity of fuel injected into a combustion chamber and hence optimized fuel consumption and emissions. The application according to this solution of at least one electrical charge to the actuator at two times, a first time for nominal control of the piezoelectric actuator as a function of the injection calibration, then a second time for its polarization, avoids the polarization operation causing engine noise and in particular injection rattle. The method according to this solution can advantageously be used in an engine control unit (ECU) of the vehicle, by means of software for implementing the method, for controlling all engine injectors. It should be noted that this method may be integrated in the ECU computer of existing vehicles by means of a simple modified software for control/adjustment of the piezoelectric actuators of the engine injectors.

Conventionally, piezoelectric injectors are voltage-controlled by the engine control unit using a constant maximum current for a given engine cycle and cylinder, for application of the nominal electrical charge for commanding the opening of the injectors. The injector is therefore controlled by modifying the electrical voltage applied at the terminals of its piezoelectric actuator as a function of the common fuel rail pressure supplying the injectors, in order to provide precisely the energy required for the actuator to overcome the rail pressure which varies as a function of engine speed. However, depending on the engine speed concerned, in particular at low speeds for example at idle and just above, the injector opening time is reduced because of the low quantity of fuel injected into the combustion chamber, and the time available for applying the polarization charge during the opening of an injector may therefore be very short, even to the point of preventing application of the entire polarization charge. The application of a polarization charge according to patent application FR 1254719 filed on 23 May 2012 still does not in fact allow a significant polarization voltage to be attained, in particular in cases of a short injector opening time.

SUMMARY OF THE INVENTION

The aim of the present invention is to remedy these drawbacks and in general to improve the method described above. More precisely, it consists of the step of application of said electrical polarization charge comprising a prior step of increasing the value of the polarization charge current applied to the piezoelectric actuator to a value greater than that of the nominal current of the nominal charge.

The increase in charge current value applied to the polarization charge allows a reduction in the application time of said electrical polarization charge. The method according to the invention allows attainment in a shorter time of a polarization voltage which is identical to or close to that which would be obtained with a longer time, according to the current value of the nominal control charge. Alternatively if required, for a given time available, the invention allows attainment of a higher polarization voltage than that which would be obtained with a smaller current.

According to an advantageous characteristic, the method according to the invention also comprises the following steps:
  definition of a polarization charge to be attained,
  prior to application of said nominal control charge, sending of a request to the engine control unit to establish the specified electrical control time of the injector,
  selection of a nominal or greater current value for application of said polarization charge to be attained, as a function of the specified electrical control time of the injector.

The electrical control time of the injector is defined as being the holding time for the charge applied to the piezoelectric actuator. According to this characteristic, an additional management mode is proposed for controlling the polarization charge: if the electrical control time of the injector is reduced and the time available for applying the polarization charge is therefore short, it may be suitable to control this charge with a current greater than the nominal current in order to optimize the polarization voltage in the electrical control time available, and hence profit from short openings to nonetheless apply a polarization charge to the piezoelectric actuator.

According to an advantageous characteristic, the step consisting of selecting a current value for application of said polarization charge to be attained comprises a step consisting of determining a threshold value in relation to which said specified electrical control time of the injector will be compared, such that:
  if said specified electrical control time of the injector is less than said predefined threshold value, application of said polarization charge by controlling the polarization current greater than the nominal current of the nominal control charge,
  if said specified electrical control time of the injector is greater than said determined threshold value, application of said polarization charge by controlling the polarization current using the value of the current of the nominal control charge.

This characteristic offers the possibility of current-controlling a polarization charge for electrical control times of an injector which are less than a predetermined value, below which the time available no longer allows application to the piezoelectric actuator of a (polarization) voltage which is greater than the voltage of the nominal electric control charge, and therefore does not allow application of a so-called polarization charge, or at least does not allow attainment of a significant polarization charge.

According to an advantageous characteristic, said polarization charge, defined by a corresponding profile of current applied to the piezoelectric actuator, is decoupled from said nominal control charge.

Because the charges are decoupled, there is no need to modify the nominal control charge of the piezoelectric actuator conventionally applied by the engine control unit in connection with the engine torque required or the engine speed, and the polarization over-charge can be rendered independent of this nominal control charge.

According to an advantageous characteristic, the electrical voltage resulting from the application of the nominal control charge, and the electrical voltage resulting from application of the polarization charge by current control of the piezoelectric actuator, form a platform in the gradient of the voltage applied to the latter.

This voltage platform applied to the actuator as a function of time allows action in order to reduce the noise of the injector during its opening. In fact application of the first electrical voltage with limited energy (in order to reduce the mechanical noise where applicable) triggers the opening of the injector valve means, and the second so-called polarization voltage is then applied. The platform may be reduced to a minimum and be virtually imperceptible, for example reduced to a very small fraction of a second, of the order of around a microsecond, or form a more marked platform greater than or equal to several microseconds, for example 10 to 100 µs. The platform may advantageously act on the time separating the nominal charge and the polarization charge applied to the piezoelectric actuator, for example as a function of the time available for application of the polarization charge between the charge for opening the injector and the discharge for its closure.

According to an advantageous characteristic, the step consisting of commanding the closure of the injector comprises the application of a first electrical discharge of the piezoelectric actuator down to the nominal control charge thereof, followed by a second electrical discharge of the actuator until closure of the valve means.

The division of the electrical discharges allows where required a reduction in noise of closure of the injector, by means of a discharge of the actuator performed at two times.

According to an advantageous characteristic, said first and second electrical discharges of the piezoelectric actuator are decoupled.

According to an advantageous characteristic, the first electrical discharge of the piezoelectric actuator down to the nominal control charge is obtained by the application of a first electrical discharge current, reducing the voltage at the terminals of the piezoelectric actuator to the nominal charge voltage, and the second electrical discharge of the actuator is obtained by the application of a second electrical discharge current different from the first discharge current.

The division of electrical discharges, forming a platform in the electrical voltage during the discharge applied to the piezoelectric actuator, allows a reduction in the noise of the injector on its closure if required and advantageously allows decoupling of the discharge currents applied to the actuator.

According to an advantageous characteristic, the electrical voltage at the terminals of the piezoelectric actuator, resulting from application of said first and second successive electrical discharges, forms a platform in the gradient of the discharge voltage applied to the piezoelectric actuator.

This voltage platform applied to the actuator as a function of time allows action in order to reduce the noise of the injector during its closure if required. The platform may be reduced to a minimum and be virtually imperceptible, for example reduced to a very small fraction of a second, of the order of around a microsecond, or form a more marked platform greater than or equal to several microseconds, for example 10 to 100 µs. The platform advantageously allows action on the time separating the electrical discharges applied to the piezoelectric actuator for closure of the injector, for example as a function of the available time remaining before this injector closure. In the discharge voltage gradient, the platform advantageously allows action on the decoupling of discharge currents corresponding to the polarization discharge and the nominal control discharge applied to the actuator.

According to an advantageous characteristic, the increase in current between the nominal control charge and the polarization charge is of the order of one amp.

Further characteristics and advantages will appear from the description below of exemplary embodiments of a method according to the invention, accompanied by the attached drawings which are given purely as illustrative and non-limitative examples.

BRIEF DESCRIPTION OF THE DRAWING FIGURES

Figure 1B:
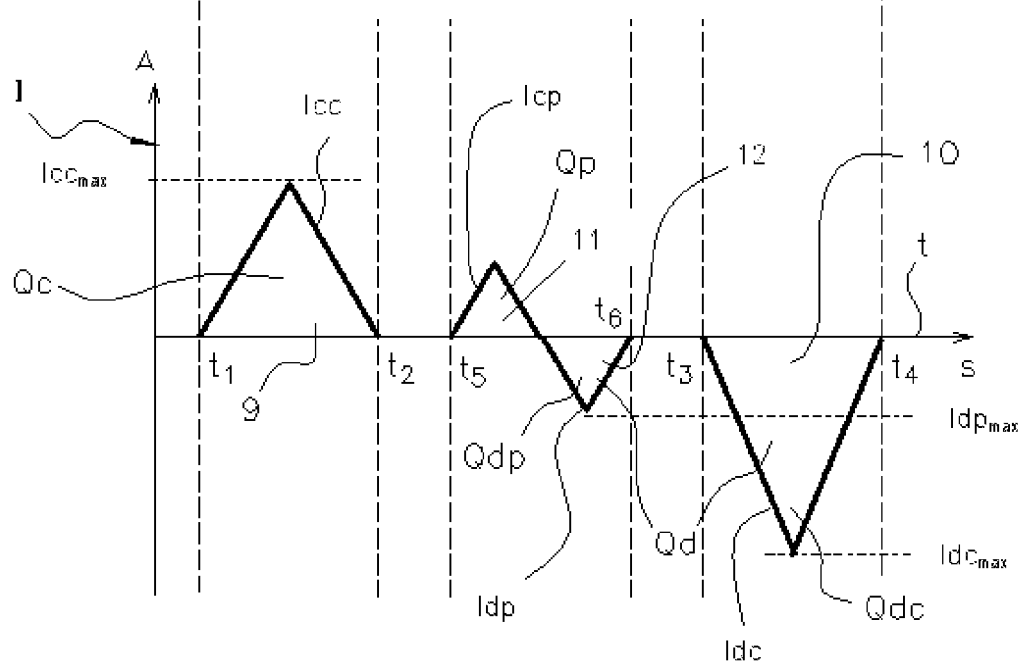

FIGS. 1a and 1b represent two synchronized schematic diagrams of an example of the method for controlling an exemplary piezoelectric actuator according to the prior art, comprising a step of application of a polarization charge during opening of the injector, relating respectively to:
an example of a profile of the voltage at the terminals of the piezoelectric actuator as a function of time during the opening of the actuator,
an example of an intensity profile of the charge/discharge current passing through the piezoelectric actuator as a function of time.

Figure 2A:
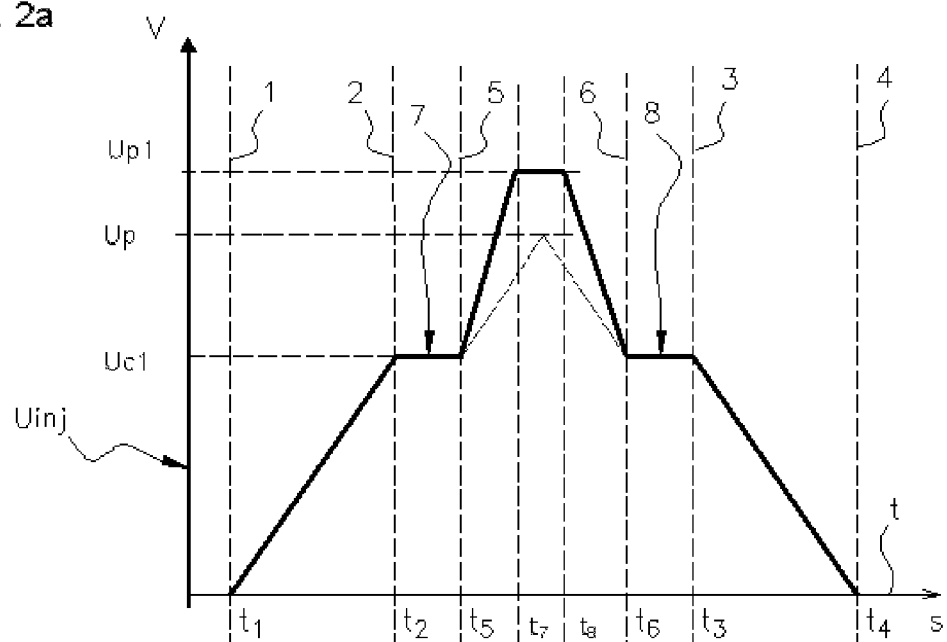
Figure 2B:
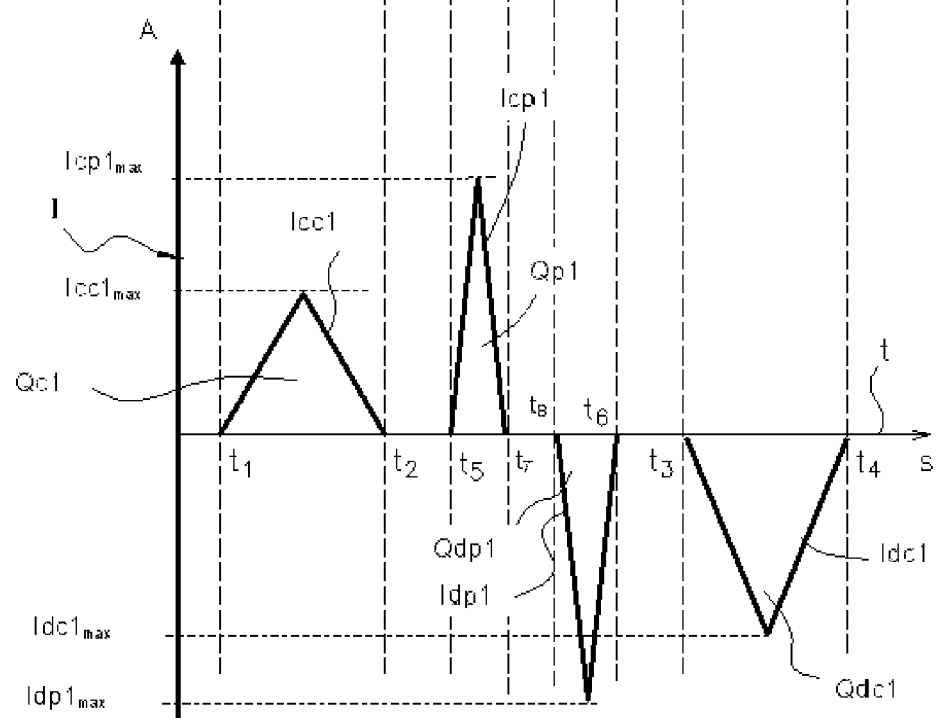

FIGS. 2a and 2b represent two synchronized schematic diagrams of the profile of the voltage at the terminals of the piezoelectric actuator and the intensity profile of the charge/discharge current passing through this piezoelectric actuator as a function of time during the opening of the actuator, according to an exemplary embodiment of a control method according to the invention for said piezoelectric actuator.

Figure 3:
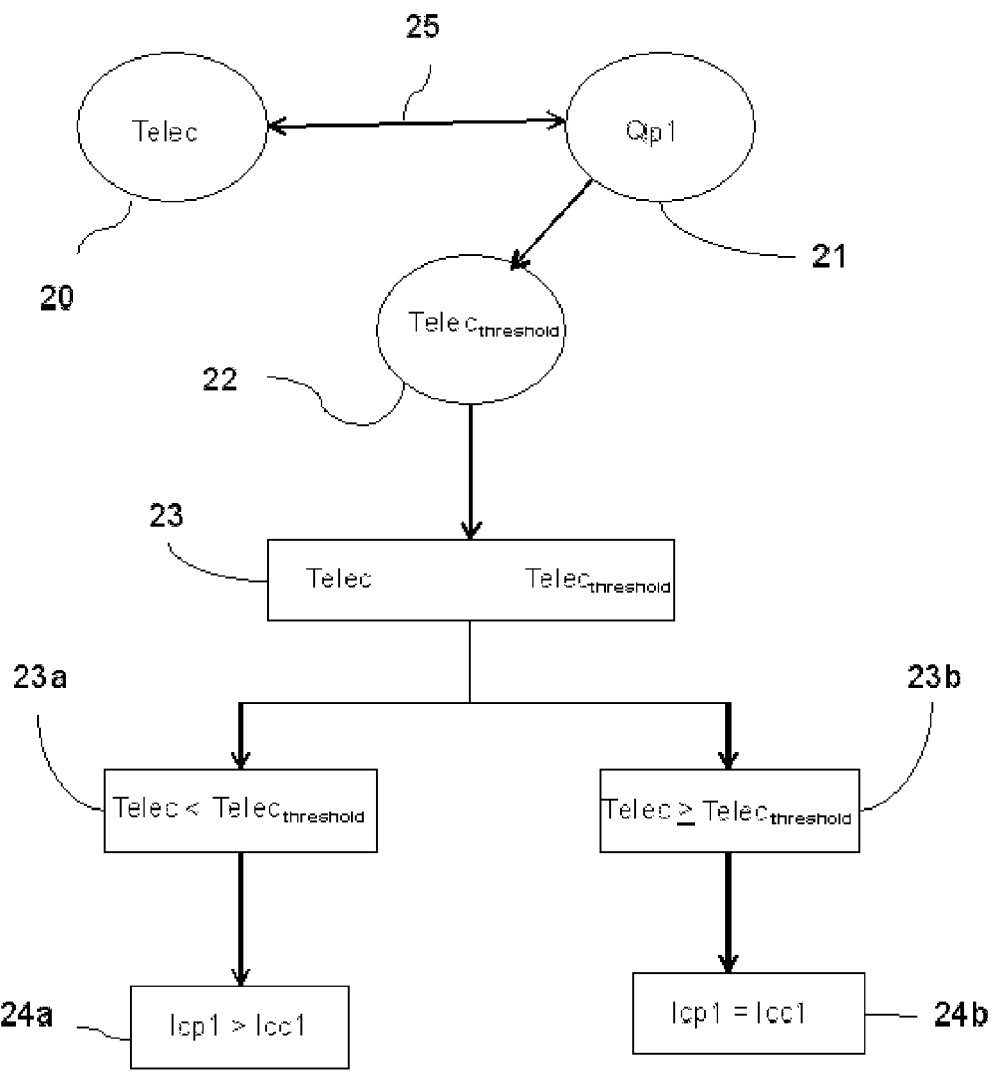

FIG. 3 is a logic diagram of an exemplary embodiment of a control method according to the invention for a piezoelectric actuator.

DETAILED DESCRIPTION OF THE INVENTION

The time scale on the two diagrams in FIGS. 1a and 1b is represented synchronized, for example the four dotted vertical lines 1, 2, 3, 4 drawn across the two FIGS. 1a and 1b correspond to four different instants $t_1$, $t_2$, $t_3$, $t_4$ on the time scale respectively, each of these four instants $t_1$, $t_2$, $t_3$, $t_4$ being the same for both diagrams.

FIG. 1a shows that the electrical charge voltage Uinj applied, shown on the ordinate axis, comprises a constant and continuous gradient from instant $t_1$ which is shown on the abscissa axis t, corresponding to the time scale, instant $t_1$ corresponding to the command for opening of the injector up to instant $t_2$ which corresponds to a nominal control voltage Uc for the piezoelectric actuator applied for opening the injector, i.e. for extension of the piezoelectric actuator in response to this opening command. This nominal control voltage level Uc is predefined by an injection map of the engine (not shown) and corresponds to the minimum voltage necessary to obtain an opening of the injector, in particular producing a minimal noise, adapted for a required engine torque and the engine speed.

As shown on FIGS. 1a and 1b, the polarization charge Qp is then applied between instants $t_5$ and $t_6$. The two vertical dotted lines 5 and 6 drawn across the two FIGS. 1a and 1b correspond respectively to these two different instants $t_5$ and $t_6$ on time scale t, each of these two instants $t_5$ and $t_6$ being the same for both diagrams 1a and 1b. The electrical polarization charge Qp is obtained by application of an electrical polarization voltage Up for the piezoelectric actuator which is greater than the nominal electrical charge voltage Uc, as shown on FIG. 1a. The polarization voltage Up at the terminals of the piezoelectric actuator then remains constant for a certain time as required, if period $t_6-t_5$ is sufficiently long, which is not the case on FIG. 1a. Because of the use below the resonant frequency, the piezoelectric element behaves in effect as a capacitive element and retains its voltage Uc applied at its terminals until a specific command for electrical discharge of the actuator.

It is noted that in the example shown on FIG. 1a, the first electrical voltage Uc and the second electrical voltage Up form a platform 7 in the gradient of the voltage applied at the terminals of the piezoelectric actuator. This voltage platform 7, representing the period between the end of application of the electrical charge Qc for commanding the opening of the actuator and the start of application of the polarization charge Qp, or a time equal to $t_5-t_2$, may lie between 0 (excluded) and a few microseconds, or form a more marked platform of the order of several microseconds, for example 10 to 100 µs, depending on the conventional time available for application of a polarization charge during opening of the injector, given by the engine control unit. The minimum time is preferably defined so that charges Qc and Qp are decoupled, i.e. separated in time.

Also, the voltage gradients applied at the terminals of the piezoelectric actuator, between instants $t_1$ and $t_2$ firstly for commanding the opening of the injector, and after instant $t_2$ secondly with the aim of polarization of the actuator, are shown on FIG. 1a as having the same value or substantially the same value. These gradients are identical and are imposed at the same value because the maximum charge current is the same for the control charge and for the polarization charge, for a given engine cycle and cylinder, according to the prior art.

The next step consists of commanding the closure of the injector and preferably comprises application of a first electrical discharge Qdp of the piezoelectric actuator down to the nominal control charge Qc thereof, or substantially this nominal charge Qc, defining instant $t_6$, followed at instant $t_3$ after $t_6$ by a second electrical discharge Qdc of the actuator until closure of the valve means, as shown on FIG. 1b.

In this example, the first discharge Qdp is applied before instant $t_3$, i.e. before closure of the injector, such that the first electrical discharge Qdp and the second electrical discharge Qdc of the piezoelectric actuator are preferably decoupled, as shown on FIG. 1b. In the example, the decoupling of discharges Qdp and Qdc is reflected by the presence of a period not equal to zero between instant $t_6$, corresponding to the end of polarization discharge Qdp, and the later instant $t_3$ corresponding to the start of the discharge Qdc for commanding the closure of the injector.

As shown on FIG. 1a which corresponds to and is synchronized with FIG. 1b, the first electrical discharge Qdp of the piezoelectric actuator down to the nominal control charge Qc is advantageously formed by a first electrical discharge current Idp which for example reduces the polarization voltage Up at the terminals of the piezoelectric actuator to the nominal charge voltage Uc, the second electrical discharge current Qdc of the actuator consisting of a second electrical discharge current Idc until the piezoelectric actuator is returned to its initial length, leading to closure of the injector. The first electrical discharge current Idp and the second electrical discharge current Idc may for example be obtained by short-circuiting the terminals of the piezoelectric actuator. The maximum polarization discharge current $Idp_{max}$ is limited by instant $t_3$ at which the command for closure of the injector must be given, and may be less than the maximum control discharge current $Idc_{max}$, as shown. The discharge current $Idc_{max}$ is normally greater in absolute value than the maximum charge current $Icc_{max}$.

It is noted on FIG. 1a that the profile of the voltage at the terminals of the actuator resulting from successive electrical discharges Qdp and Qdc of the piezoelectric actuator preferably forms a platform 8 in the gradient of the discharge voltage which is applied to the piezoelectric actuator. This voltage platform 8, representing the period elapsing between instant $t_6$ at the end of application of the electrical polarization discharge Qdp of the actuator and the later instant $t_3$ at the start of application of the control discharge Qdc, or a time equal to $t_3-t_6$, may lie between 0 (excluded) and a few microseconds, or form a more marked platform of the order of several microseconds, for example 10 to 100 µs, according to the conventional time available for application of the discharge for commanding closure of the injector, given by the engine control unit which imposes the electrical control time for the injector. The minimum time is preferably defined such that the electrical discharges Qdp and Qdc are decoupled, i.e. separated in time.

Also, the gradients of voltage fall applied to the piezoelectric actuator on FIG. 1a, for polarization discharge firstly (before instant $t_3$), and for discharge of the actuator for closure of the injector (from instant $t_3$), are shown on FIG. 1a as having the same value or substantially the same value. These gradients are imposed by the single discharge current, for the same reasons as the imposition of the charge current as explained above.

From instant $t_4$, the piezoelectric actuator recovers its initial contracted length corresponding to closure of the injector.

The period of opening the injector valve means therefore substantially lies between $t_2$ and $t_4$. At instant $t_3$, the voltage at the piezoelectric actuator terminals is substantially equal to Uc in the example shown. In the absence of application of a polarization charge Qp, the nominal control voltage Uc applied to the piezoelectric actuator would be held substantially constant between $t_2$ and $t_3$ at the level of this nominal voltage Uc, because of the behavior of the piezoelectric element as a capacitive element.

FIG. 1b shows diagrammatically on the ordinate axis I corresponding to the charge/discharge current passing through the piezoelectric actuator:

a first curve of intensity of a charge current Icc between instants $t_1$ and $t_2$, corresponding to application of the nominal control voltage Uc with the aim of opening of the injector by increasing the actuator length, a second curve of intensity of a second discharge current Idc for closure of the injector, which corresponds to a fall in voltage Uinj between instants $t_3$ and $t_4$, resulting from the electrical discharge of the piezoelectric actuator from the control voltage Uc to a zero or substantially zero voltage in order to obtain the rapid contraction of said actuator and hence the closure of the injector, a third curve of intensity of a charge current Icp between instants $t_5$ and $t_6$, corresponding to application of the polarization voltage Up with the aim of polarization of the piezoelectric actuator, a fourth curve of intensity of discharge current Idp representative of the first discharge Qdp of the piezoelectric actuator down to the opening control charge Qc, which corresponds to a fall in voltage Uinj from the attained polarization voltage Up to the opening control voltage Uc corresponding to instant $t_6$, resulting from the electrical discharge of the piezoelectric actuator in order to obtain a rapid contraction thereof before application of the second current discharge Qdc as described above.

The electrical charges Qc and Qp, applied to the piezoelectric actuator for opening the injector and for polarization, may be calculated in the known manner from areas 9 and 11 on FIG. 1b, defined between the respective curves of charge current Icc and Icp and the abscissa axis t. The same applies to the electrical discharges Qdp and Qdc applied to the piezoelectric actuator to close the injector, which may be calculated respectively from areas 12 and 10 on FIG. 1b, defined between the respective curves of current discharges Idp and Idc and the abscissa axis t for closure of the injector, and which for example is substantially equal to $-(Qc+Qp)$. An absolute discharge value greater than Qc+Qp is preferred in order to guarantee closure of the injector.

The maximum available charge current $Icc_{max}$ is identical for the curves of currents Icc and Icp, as shown on FIG. 1b, and is supplied for example by a single output from the injector control electronics controlled by the engine control unit and supplying a single maximum current I per engine cycle and per cylinder. It is clear from FIG. 1b that the maximum current Icp does not attain current $Icc_{max}$ because the application time is shorter than the application time of current Icc. The ascending gradients of currents Icc and Icp are identical, as are the respective descending gradients.

The respective maximum discharge currents $Idp_{max}$ and $Idc_{max}$ for the two electrical discharges of the actuator may be different for the same reason as given above.

The example of the method according to the invention shown diagrammatically on FIGS. 2a and 2b will now be described.

For FIGS. 2a and 2b, the same references as those in FIGS. 1a and 1b have been used for the same elements. However on these FIGS. 2a and 2b, the specific references for current, voltage and electrical charge/discharge have been allocated an additional suffix 1. The description above in relation to FIGS. 1a and 1b remains valid in general for FIGS. 2a and 2b, with the exception of the polarization charge Qp1 and discharge Qdp1 for which the respective charge current Icp1 and discharge current Idp1 are different, as will be explained in detail below. Reference should therefore be made to FIGS. 1a and 1b in relation to the identical references used and not described on FIGS. 2a and 2b.

The example of the method according to the invention shown diagrammatically on FIGS. 2a and 2b is an example of a method for controlling a piezoelectric actuator for injection of fuel in an internal combustion engine of a vehicle (not shown), this piezoelectric actuator acting on a valve means to open or close the injector, respectively allowing or preventing the injection of fuel into a combustion chamber of the engine. It is specified here that the terms "opening and closure of the injector valve means" and "opening and closure of the injector" are considered equivalent. It should be noted that only the signals for voltage and charge current intensity applied to and passing through the piezoelectric actuator have been shown on the figures, the method according to the invention described being able to be applied to an internal combustion engine of the known type fitted with injectors also of the known type, which have not therefore been depicted.

The control method according to FIGS. 2a and 2b is applied by an engine control unit ECU (not shown) of the known type on-board a vehicle in operation, for example by means of control software implemented in the engine control unit, and comprises the following steps consisting of:

application to the piezoelectric actuator of a first nominal electrical charge Qc1 necessary for opening the injector, called the nominal control charge Qc1, as shown on FIG. 2b, as a function of the torque required and the engine speed, according to a nominal current Icc1, so as to open the valve means of the injector for the injection of fuel into the combustion chamber, application to the piezoelectric actuator of at least one second electrical charge Qp1, or polarization charge Qp1, in addition to said nominal control charge Qc1, on said nominal control charge Qc1 after application thereof and before a step consisting of commanding a closure of the injector, as shown on FIG. 2b, so as to polarize the piezoelectric actuator during an opening phase of the injector and during the injection of fuel into the combustion chamber, commanding the closure of the injector so as to stop the injection of fuel by application to the piezoelectric actuator of at least one electrical discharge, in this case two successive discharges Qdp1, Qdc1 in the example shown, so as to close the valve means, as shown on FIG. 2b.

According to the invention, the step of application of the electrical polarization charge Qp1 comprises a prior step of increasing the value of the polarization charge current Icp1 applied to the piezoelectric actuator to a value greater than that of the nominal current Icc1 of the nominal charge Qc1, to attain a maximum value of the polarization charge current $Icp1_{max}$ greater than the maximum value of the nominal current $Icc1_{max}$ of the nominal charge for opening the injector, as shown on FIG. 2b.

This increase in charge current intensity may be obtained for example by means of generating a second maximum available current at the terminals of the piezoelectric actuator, in a manner known to the person skilled in the art, for example by configuration of the ASIC (Application Specific Integrated Circuit) of the engine control unit, constituting the control electronics for the piezoelectric actuators, so as to manage two different current configurations. Each current configuration will then be applied optionally on each command of the injector for an injection of fuel into the combustion chamber. It is possible to provide two current configurations with said ASIC: a first configuration for the charge current Icc1 and a second configuration for the polarization current Icp1, the current of the second configuration being greater than that of the first configuration. For example, the increase in current between the nominal control charge Qc1 and the polarization charge Qp1 may be of the order of at least one amp. The control method for the piezoelectric actuator according to the invention which controls the choice of current configuration at the terminals of the piezoelectric actuator may be implemented by means of a control software installed in the engine control unit of the vehicle.

As shown on FIG. 2b, the polarization charge Qp1 defined by the corresponding profile of current Icp1 applied to the piezoelectric actuator is preferably decoupled from the nominal control charge Qc1, itself defined by the corresponding profile of current Icc1.

As shown on FIG. 2a, the electrical voltage Uc1 resulting from application of the nominal control charge Qc1, and the electrical voltage Up1 resulting from application of the polarization charge Qp1 by current control of the piezoelectric actuator, advantageously form a platform 7 in the gradient of the voltage applied to said actuator.

On FIG. 2a, the voltage Uc1 applied for opening the injector may advantageously be identical to the voltage Uc of the prior art, shown on FIGS. 1a and 1b. The voltage Up1 shown on FIG. 2a, corresponding to the polarization voltage obtained in the time interval between $t_5$ and $t_6$ and resulting from application of an electrical charge Qp1 greater than the electrical polarization charge Qp of the prior art, in this example is greater than Up, as shown for an identical time interval equal to $t_6-t_5$. Increasing the polarization charge current Icp allows attainment of an increased polarization voltage Up1 in short time intervals for which the charge current Icc1 for opening the injector would not have allowed attainment of a polarization voltage level in general.

The step consisting of commanding closure of the injector advantageously comprises the application of a first electrical discharge Qdp1 of the piezoelectric actuator down to nominal control charge Qc1 thereof, followed by a second electrical discharge Qdc1 of the actuator until closure of the valve means, so as to restore the piezoelectric actuator to its initial length and thus close the valve means in two times, as shown on FIG. 2b.

The first electrical discharge Qdp1 of the piezoelectric actuator down to the nominal control charge Qc1 is for example obtained by application of a first electrical discharge current Idp1, reducing the voltage Uinj at the terminals of the piezoelectric actuator to the nominal charge voltage Uc1, and the second electrical discharge Qdc1 of the actuator is for example obtained by application of the second electrical discharge current Idc1, reducing the voltage Uinj at the terminals of the piezoelectric actuator to a zero or substantially zero voltage, restoring the piezoelectric actuator to its initial length for closure of the actuator.

The first discharge Qdp1 may be obtained by means of a discharge current Idp1 of absolute value greater than the discharge current Idc1 of the second electrical discharge Qdc1, as shown on FIG. 2b. In fact this FIG. 2b shows that the maximum current $Idp1_{max}$ is in absolute value greater than the maximum current $Idc1_{max}$. The first Qdp1 and the second Qdc1 electrical discharges of the piezoelectric actuator are preferably decoupled, as shown on FIG. 2b.

It is noted on FIG. 2a that the electrical voltage Uinj at the terminals of the piezoelectric actuator resulting from application of the first Qdp1 and second Qdc1 successive electrical discharges, advantageously form a platform 8 in the gradient of the discharge voltage applied to the piezoelectric actuator.

It should be noted that application of the polarization charge Qp1 and the polarization discharge Qdp1 which follows must take place between instants $t_2$ and $t_3$ which are advantageously determined according to the normal operation of the engine, by a conventional engine control unit. Advantageously, application of the method according to the invention does not disrupt the normal opening and closure of the injectors and always takes place between these instants $t_2$ and $t_3$ which respectively represent the end of application of the conventional nominal charge Qc1 for commanding the opening of the injector and the start of application of the conventional discharge Qdc1 for commanding the closure of the injector.

The polarization voltage Up1 is attained at instant $t_7$ at the end of application of the polarization charge Qp1, and begins to decrease at instant $t_8$ at the start of application of the polarization discharge Qdp1, as shown on FIGS. 2a and 2b. The polarization voltage Up1 is held constant or substantially constant between these instants $t_7$ and $t_8$ because of the capacitive behavior of the piezoelectric actuator. In the example shown, we note that the choice of a current Icp1 of increased intensity in relation to current Icc1 also allows the piezoelectric actuator to be held at the polarization voltage Up1 for a certain time corresponding to $t_8-t_7$.

The application of a polarization charge current Icp1 greater than the nominal control charge current Icc1 thus allows a given polarization voltage Up1 to be attained more quickly and hence said polarization voltage to be maintained for longer. The application of a discharge current Idp1, which is also higher than the current Icc1 of the nominal control charge Qc1 in absolute value, for example substantially equal to the absolute value of the polarization charge current Icp1, helps extend this duration of application of the polarization voltage Up1 between these instants $t_7$ and $t_8$. The current Idc1 for the second electrical discharge Qdc1 may itself be for example of the order of current Icc1 in absolute value.

FIG. 3 shows a logic diagram of an example of the method as described above with the aid of FIGS. 2a and 2b, which may be applied in the engine control unit, integrated in the conventional injector management process, with the following steps: from a request 20 for opening of a given injector sent by the engine control unit (not shown), defining a specific electrical control time Telec for the injector corresponding to a specific quantity of fuel to be injected as a function of the engine torque and speed to be attained:

Step 21: definition of a polarization charge Qp1 to be attained during opening of this injector, which will be applied as explained above with reference to FIGS. 2a and 2b, Step 25: prior to application of the nominal control charge Qc1, with the aim of opening of the injector, sending of a request to the engine control unit to establish the specified electrical control time Telec of the injector, Steps 22, 23, 23a, 23b, 24a, 24b: selection of a current value for application of the polarization charge Qp1 to be attained, nominal current Icc1 or greater than the nominal current Icc1, as a function of the specified electrical control time Telec of the injector.

For example, as shown on FIG. 3, the step consisting of selecting a current value Icp1 for application of the polarization charge Qp1 to be attained comprises a step 22 consisting of determining a threshold value $Telec_{threshold}$ in relation to which the specified electrical control time Telec of the injector will be compared during step 23, such that:

Step 23a: if the specified electrical control time Telec of the injector is less than the determined threshold value $Telec_{threshold}$, application of the polarization charge Qp1 by controlling 24a the polarization current Icp1 greater than the nominal current Icc1 of the nominal control charge Qc1, Step 23b: if the specified electrical control time Telec of the injector is greater than or equal to the determined threshold value $Telec_{threshold}$, application of the polar-ization charge Qp1 by controlling 24b the polarization current Icp1 using the value of the current Icc1 of the nominal control charge Qc1.

A value of $Telec_{threshold}$ may for example be of the order of 300 μs, similar to an electrical control time of the injector between $t_3$ and $t_1$ as shown on FIG. 2a or 2b. This is precisely the time lying between the command for opening and the command for closing the injector.

It should be noted that FIGS. 2a and 2b illustrate for example a main fuel injection, where it is understood that the method according to the invention may be applied to a cycle comprising multiple injections, for example performed in several occasions divided into at least one pilot injection and at least one main injection, the polarization charge Qp1 or voltage Up1 preferably being in this case applied during the main injection.

Preferably, the polarization charge is applied permanently and continuously during operation of the engine in the moving vehicle. The control of the current of the polarization charge using a time threshold for the injector opening allows expansion of the application field of this polarization charge to all engine speeds, covering virtually all injector opening times. Alternatively however the polarization charge may be deactivated above a predefined threshold of torque/rotation speed values of the engine corresponding to nominal voltage values for controlling the piezoelectric actuators, close to the polarization voltage.

For example, the increase in electrical voltage between the nominal charge voltage Uc1 and the polarization voltage Up1 may be between 0 (excluded) and 40 volts, attaining a maximum value of polarization voltage Up1 of the order of 140 volts for example, the range used for the control voltages Uc1 of the piezoelectric actuator as a function of the engine speed and engine torque required lying substantially between 100 and 140 volts in this example. When the application of the polarization charge is controlled by current, the increase in current I between the nominal control charge Qc1 and the polarization charge Qp1 is advantageously of the order of one to several amps.

The polarization charge as described with reference to FIGS. 2a and 2b is for example advantageously applied continuously to all injectors of the engine of the vehicle, on each opening of an injector for a main fuel injection.

The invention claimed is:

1. A method for controlling at least one piezoelectric actuator of a fuel injector for an internal combustion engine of a vehicle, said at least one piezoelectric actuator acting on a valve to open or close said injector, respectively allowing or preventing the injection of fuel into a combustion chamber of the engine, said method being applied by an engine control unit on-board the vehicle in operation and comprising the following steps:

from a request for opening of a given injector sent by the engine control unit, defining a specific electrical control time (Telec) for the injector corresponding to a specific quantity of fuel to be injected as a function of the engine torque and speed to be attained, application to the piezoelectric actuator of a first nominal electrical charge (Qc1) necessary for opening the injector, called the nominal control charge (Qc1), according to a nominal current (Icc1), as a function of the torque required and the engine speed, so as to open the valve means of the injector for the injection of said specific quantity of fuel into the combustion chamber, application to the piezoelectric actuator of at least one second electrical charge (Qp1), called the polarization charge (Qp1), in addition to said nominal control charge (Qc1), on said nominal control charge (Qc1) after application thereof and before a step of commanding a closure of the injector, so as to polarize the piezoelectric actuator during an opening phase of the injector and during the injection of said specific quantity of fuel into the combustion chamber, commanding the closure of the injector so as to stop the injection of said specific quantity of fuel by application to the piezoelectric actuator of at least one electrical discharge (Qdp1, Qdc1), so as to close the valve means, wherein the step of application of said electrical polarization charge (Qp1) comprises a prior step of increasing the value of the polarization charge current (Icp1) applied to the piezoelectric actuator, to a value greater than that of the nominal current (Icc1) of the nominal control charge (Qc1).

2. The method as claimed in claim 1, further comprising the following steps:

definition of a polarization charge (Qp1) to be attained, prior to application of said nominal control charge (Qc1), sending of a request to the engine control unit to establish the specified electrical control time (Telec) of the injector, selection of a nominal or greater current value for application of said polarization charge (Qp1) to be attained, as a function of the specified electrical control time (Telec) of the injector.

3. The method as claimed in claim 2, wherein the step of selecting a current value for application of said polarization charge (Qp1) to be attained comprises a step of determining a threshold value ($Telec_{threshold}$) in relation to which said specified electrical control time (Telec) of the injector will be compared, such that:

if said specified electrical control time (Telec) of the injector is less than said determined threshold value ($Telec_{threshold}$) application of said polarization charge (Qp1) by controlling (24a) the polarization current (Icp1) greater than the nominal current (Icc1) of the nominal control charge (Qc1).

4. The method as claimed in claim 1, wherein said polarization charge (Qp1), defined by a corresponding profile of current applied to the piezoelectric actuator, is decoupled from said nominal control charge (Qc1).

5. The method as claimed in claim 1, wherein the electrical voltage (Uc1) resulting from the application of the nominal control charge (Qc1), and the electrical voltage (Up1) resulting from application of the polarization charge (Qp1) by current control of the piezoelectric actuator, form a platform in the gradient of the voltage (Uinj) applied to the latter.

6. The method as claimed in claim 1, wherein the step of commanding the closure of the injector comprises the application of a first electrical discharge (Qdp1) of the piezoelectric actuator down to the nominal control charge (Qc1) thereof, followed by a second electrical discharge (Qdc1) of the actuator until closure of the valve means.

7. The method as claimed in claim 6, wherein said first (Qdp1) and second (Qdc1) electrical discharges of the piezoelectric actuator are decoupled.

8. The method as claimed claim 3, wherein the step of commanding the closure of the injector comprises the application of a first electrical discharge (Qdp1) of the piezoelectric actuator down to the nominal control charge (Qc1) thereof, followed by a second electrical discharge (Qdc1) of the actuator until closure of the valve means, and the first electrical discharge (Qdp1) of the piezoelectric actuator down to the nominal control charge (Qc1) is obtained by the application of a first electrical discharge current (Idp1) reducing the voltage (Uinj) at the terminals of the piezoelectric actuator to the nominal charge voltage (Uc1), and wherein the second electrical discharge (Qdc1) of the actuator is obtained by the application of a second electrical discharge current (Idc1) different from the first discharge current.

9. The method as claimed in claim 8, wherein the electrical voltage (Uinj) at the terminals of the piezoelectric actuator resulting from the application of said first (Qdp1) and second (Qdc1) successive electrical discharges, forms a platform in the gradient of the discharge voltage applied to the piezoelectric actuator.

10. The method as claimed in claim 1, wherein the increase in current between the nominal control charge (Qc1) and the polarization charge (Qp1) is of the order of one amp.

11. The method as claimed in claim 2, wherein said polarization charge (Qp1), defined by a corresponding profile of current applied to the piezoelectric actuator, is decoupled from said nominal control charge (Qc1).

12. The method as claimed in claim 2, wherein the electrical voltage (Uc1) resulting from the application of the nominal control charge (Qc1), and the electrical voltage (Up1) resulting from application of the polarization charge (Qp1) by current control of the piezoelectric actuator, form a platform in the gradient of the voltage (Uinj) applied to the latter.

13. The method as claimed in claim 2, wherein the step of commanding the closure of the injector comprises the application of a first electrical discharge (Qdp1) of the piezoelectric actuator down to the nominal control charge (Qc1) thereof, followed by a second electrical discharge (Qdc1) of the actuator until closure of the valve means.

14. The method as claimed in claim 4, wherein the step of commanding the closure of the injector comprises the application of a first electrical discharge (Qdp1) of the piezoelectric actuator down to the nominal control charge (Qc1) thereof, followed by a second electrical discharge (Qdc1) of the actuator until closure of the valve means, and the first electrical discharge (Qdp1) of the piezoelectric actuator down to the nominal control charge (Qc1) is obtained by the application of a first electrical discharge current (Idp1) reducing the voltage (Uinj) at the terminals of the piezoelectric actuator to the nominal charge voltage (Uc1), and wherein the second electrical discharge (Qdc1) of the actuator is obtained by the application of a second electrical discharge current (Idc1) different from the first discharge current.

* * * * *